(12) United States Patent
Kawakami et al.

(10) Patent No.: US 7,634,225 B2
(45) Date of Patent: Dec. 15, 2009

(54) SIGNAL RECEPTION DEVICE, SIGNAL RECEPTION CIRCUIT, AND RECEPTION DEVICE

(75) Inventors: Satoru Kawakami, Kanagawa (JP); Tadashi Imai, Chiba (JP)

(73) Assignee: Sony Corporation, Tokyo (JP)

( * ) Notice: Subject to any disclaimer, the term of this patent is extended or adjusted under 35 U.S.C. 154(b) by 1339 days.

(21) Appl. No.: 10/510,289

(22) PCT Filed: Apr. 2, 2003

(86) PCT No.: PCT/JP03/04238

§ 371 (c)(1),
(2), (4) Date: Oct. 6, 2004

(87) PCT Pub. No.: WO03/085851

PCT Pub. Date: Oct. 16, 2003

(65) Prior Publication Data

US 2005/0122428 A1    Jun. 9, 2005

(30) Foreign Application Priority Data

Apr. 8, 2002  (JP) ............................. 2002-104756
Apr. 26, 2002 (JP) ............................. 2002-127415

(51) Int. Cl.
*H04H 1/00* (2006.01)

(52) U.S. Cl. ................ 455/3.02; 455/150.1; 455/154.1; 455/131; 455/140; 348/553; 348/731

(58) Field of Classification Search ................ 455/3.02, 455/3.04, 3.06, 425, 22, 76, 77, 87, 575.1, 455/131, 133, 140, 575.8, 150.1, 154.1, 153.1, 455/175.1; 334/1; 315/169.4; 348/553, 348/571, 725, 731, 732, 734, 735, 634, 563; 709/204, 239
See application file for complete search history.

(56) References Cited

U.S. PATENT DOCUMENTS

| | | | | |
|---|---|---|---|---|
| 5,929,944 A | * | 7/1999 | Seo ............................. | 348/731 |
| 6,104,865 A | * | 8/2000 | Hamaguchi et al. ......... | 386/123 |
| 6,249,322 B1 | * | 6/2001 | Sugihara ..................... | 348/634 |
| 6,714,264 B1 | * | 3/2004 | Kempisty .................... | 348/732 |
| 6,771,316 B1 | * | 8/2004 | Iggulden ..................... | 348/553 |

(Continued)

FOREIGN PATENT DOCUMENTS

JP    8 298393    11/1996

(Continued)

*Primary Examiner*—Tan Trinh
(74) *Attorney, Agent, or Firm*—Frommer Lawrence & Haug LLP; William S. Frommer (57) ABSTRACT

The present invention provides a receiver that includes a plurality of tuners for receiving broadcasts such as satellite broadcast. A tuner circuit (1) includes an input terminal (11) for inputting a broadcast wave in which a video signal and/or an audio signal are modulated in a predetermined format, and a mount layer (13) on which a main circuit (12) for selecting, from the broadcast wave, a video signal and/or an audio signal included in a predetermined frequency band is mounted. In the tuner circuit (1), a first ground layer (15) is disposed, through a first dielectric layer (14), on the surface opposite to that on which the main circuit (12) of the mount layer (13) is arranged, and a second ground layer (17) is disposed through a second dielectric layer, thereby suppressing mutual interference between tuners.

9 Claims, 12 Drawing Sheets

U.S. PATENT DOCUMENTS

| | | | |
|---|---|---|---|
| 7,030,938 B2* | 4/2006 | Kawakami | 348/731 |
| 2001/0042096 A1* | 11/2001 | Ichiyoshi | 709/204 |
| 2002/0118309 A1* | 8/2002 | Kawakami | 348/731 |
| 2003/0076049 A1* | 4/2003 | Kawada et al. | 315/169.4 |

FOREIGN PATENT DOCUMENTS

| | | |
|---|---|---|
| JP | 9-283974 | 10/1997 |
| JP | 10-303565 | 11/1998 |
| JP | 11-341374 | 12/1999 |
| JP | 2001-177424 | 6/2001 |
| JP | 2001 345400 | 12/2001 |
| JP | 2002-135669 | 5/2002 |
| JP | 2002-152611 | 5/2002 |

* cited by examiner

FIG. 13

SIGNAL RECEPTION DEVICE, SIGNAL RECEPTION CIRCUIT, AND RECEPTION DEVICE

TECHNICAL FIELD

The present invention relates to a signal receiving apparatus and a signal receiving circuit, and more particularly, to a signal receiving apparatus that receives at least one broadcast wave by means of a plurality of receiving circuits or receives broadcast waves by means of corresponding receiving circuits, a signal receiving circuit that is effectively employed in the signal receiving apparatus, and a receiver having a plurality of built-in tuners.

The present application claims priority from Japanese Patent Application No. 2002-104756 filed on Apr. 8, 2002, and Japanese Patent Application No. 2002-127415 filed on Apr. 26, 2002, entire contents of which are hereby incorporated by reference into this application.

BACKGROUND ART

Apparatuses that manage video or audio contents as digital data are now being widely used, and correspondingly, TV broadcast also becomes increasingly digitalized. The more increased number of channels can be provided in digital broadcasting as compared to analog broadcasting. Further, program information or the like distributed together with video or audio signals can provide a variety of services.

For example, some of the receivers that can receive a digital satellite broadcast wave, digital terrestrial broadcast wave, or the like, include a plurality of tuner circuits, and make them work at a time to allow a viewer to enjoy TV programs timely as normal. Further, these receivers can store the TV pictures in a random-accessible recording medium such as an HDD (Hard Disc Drive), to reproduce, as needed, the immediately preceding TV pictures even while enjoying TV programs.

In this case, mutual interference in high frequency range is caused due to simultaneous use of the tuner circuits. In other words, the tuner circuits are in a state of receiving signals, from parabolic antennas independent from each other, having the same frequency yet differing in level. At this time, high-frequency current flows in respective tuner circuits, around which electric field or magnetic field is caused by radiated electromagnetic wave.

Since the tuners are attached to the back panel side of a so-called set-top box (STB) in general, sufficient space cannot be assured between the tuners in many cases. Accordingly, magnetic field or electric field generated from the respective tuner circuits affects other tuner circuits, which may cause serious electromagnetic interference such as cochannel interference.

Figure 1:
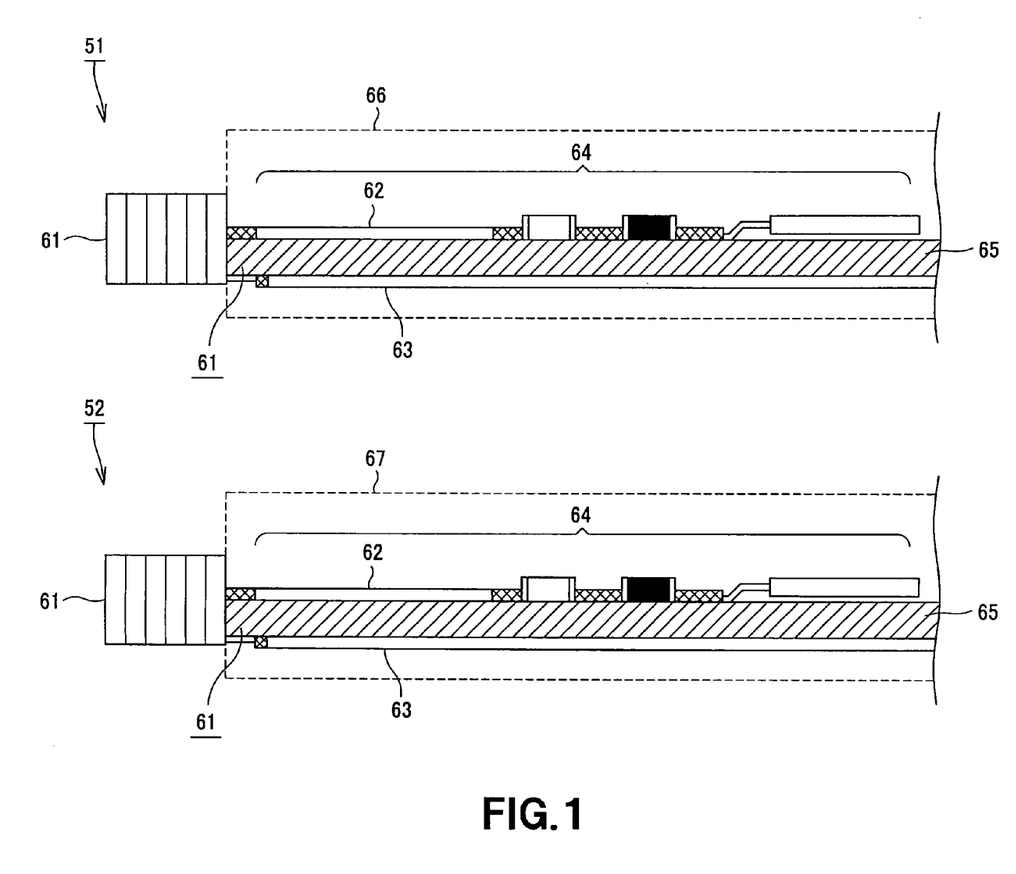
FIG. 1 is a view for explaining an arrangement of the conventional tuner circuit board in a set-top box.

Concrete configurations of tuner circuits 51 and 52 of this type are shown respectively in FIG. 1. A base plate 61 that constitutes each of the tuner circuits 51 and 52 is designed according to a so-called microstripline structure using a mount layer 62 and a ground layer 63. Thus, quantity of high frequency current flows on the side of the mount layer 62. In the above configuration, particularly, as shown in FIG. 1, when the two tuner circuits 51 and 52 are arranged adjacently in parallel, electromagnetic wave caused by high frequency current is radiated from a circuit group 64 on the mount layer 62 of the tuner circuit 51 to the tuner circuit 52 arranged next to the tuner circuit 51. To the ground layer 63, high frequency current flows through a capacity-coupled dielectric layer 65.

Note that, in FIG. 1, reference numerals 61 and 62 are input terminals of the tuner circuits 51 and 52.

To avoid the above problem, a cable is disposed within the set-top box to form a predetermined space between the tuner units, or shield cases 66 and 67 obtained by processing a metal are used to tightly cover the tuner units to shield electric field or magnetic field.

Figure 2:
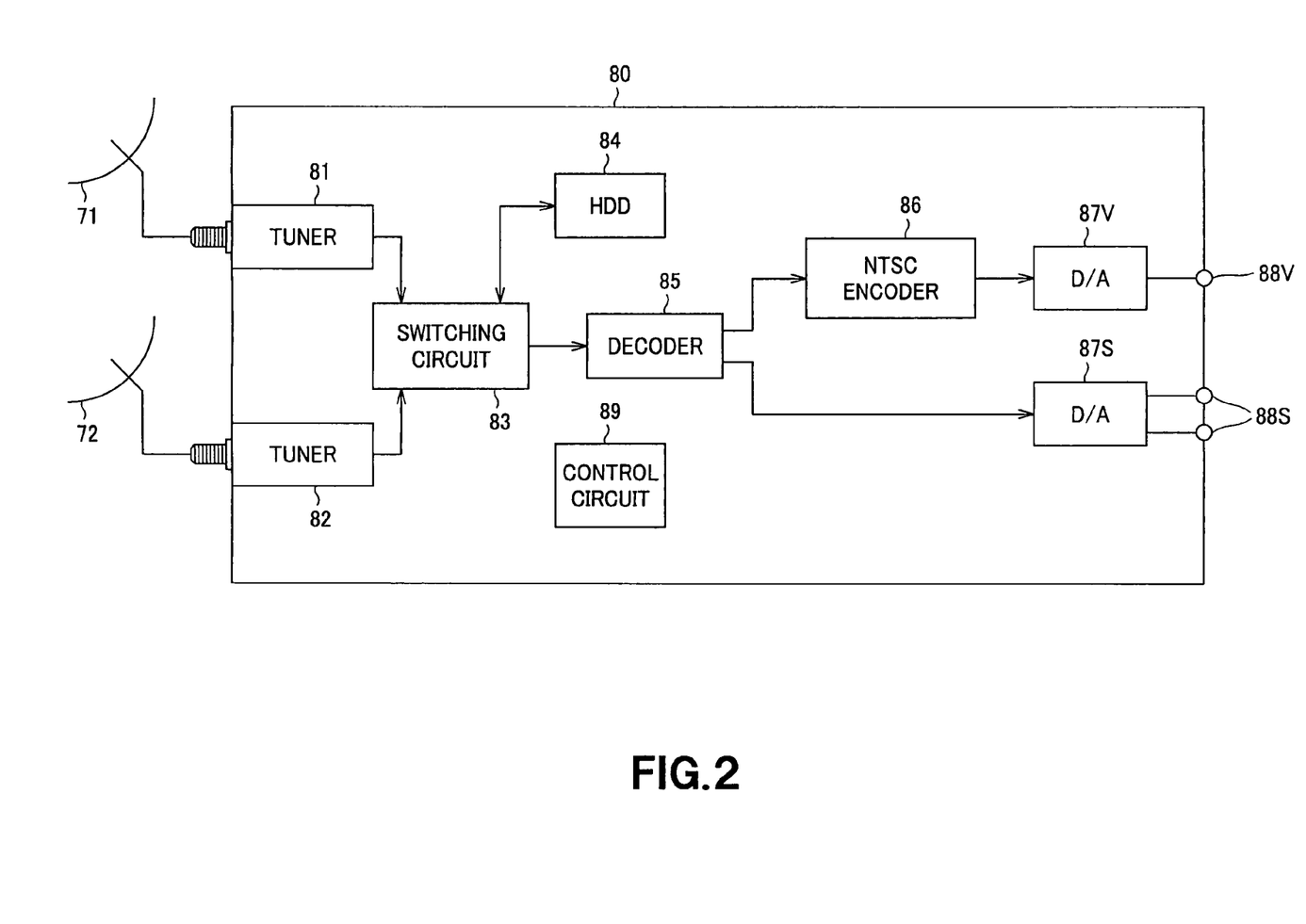
FIG. 2 is a block diagram showing a receiver to which the present invention is applied.

As shown, for example, in FIG. 2, a configuration that incorporates two receiving system and a device for storing TV programs is being considered as the receiver for digital satellite broadcasting services. This receiver receives a digital satellite broadcast from a first antenna 71, and then down-converts it to an intermediate frequency signal. The intermediate frequency signal is supplied to a first tuner 81 of a receiver 80, followed by being converted into a baseband signal and subjected to processing such as demodulation and error correction. Then, the resultant signal is output as a first TS (Transport Stream), which is then supplied to a switching circuit 83.

A second digital satellite broadcast is received by means of a second antenna 72, and then down-converted to an intermediate frequency signal. The intermediate frequency signal is supplied to a second tuner 82. The second tuner 82 then applies the same processing as the first tuner 81 to the intermediate frequency signal to output a second TS, which is then supplied to the switching circuit 83.

An HDD 84 serving as a device for storing TV programs is connected to the switching circuit 83. Either the TS output from the first tuner 81 or the TS output from the second tuner 82 is recorded (stored) in the HDD 84 through the user's operation.

Any one of the TSs output from the first tuner 81 and the second tuner 82, and the TSs read out from the HDD 84 is selected and taken through the user's operation. The taken TS is then supplied to an MPEG decoder 85, followed by being decoded into a digital video signal and digital audio signal.

The decoded digital video signal is supplied, for example, to an NTSC encoder circuit 86 and encoded into a digital video signal according to the NTSC specification. The resultant signal is then supplied to a D/A converter circuit 87V and D/A converted into an analog NTSC video signal, followed by being output from an output terminal 88V. The digital audio signal decoded by the MPEG decoder 85 is supplied to a D/A converter 87S, and D/A converted into an original analog audio signal, followed by being output from an output terminal 88S.

A system control circuit 89 has a microcomputer and supplies control signals to the respective circuits through the user's operation.

Figure 3:
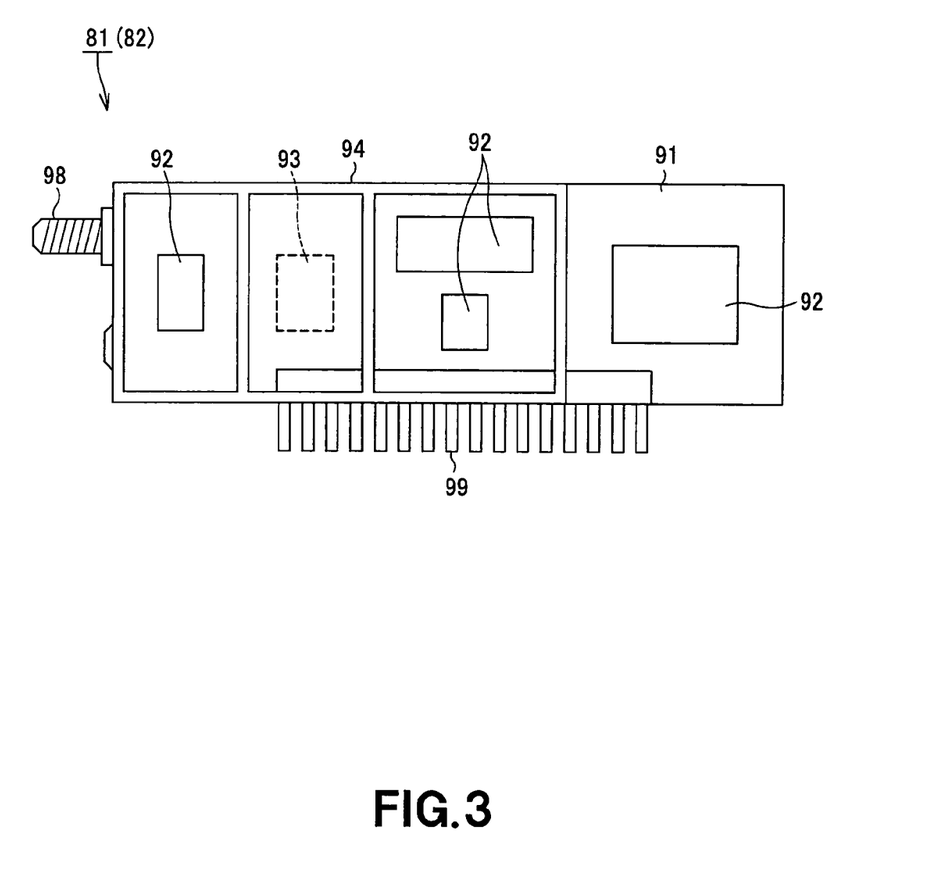
FIG. 3 is a plan view showing a printed board constituting a tuner.
Figure 4:
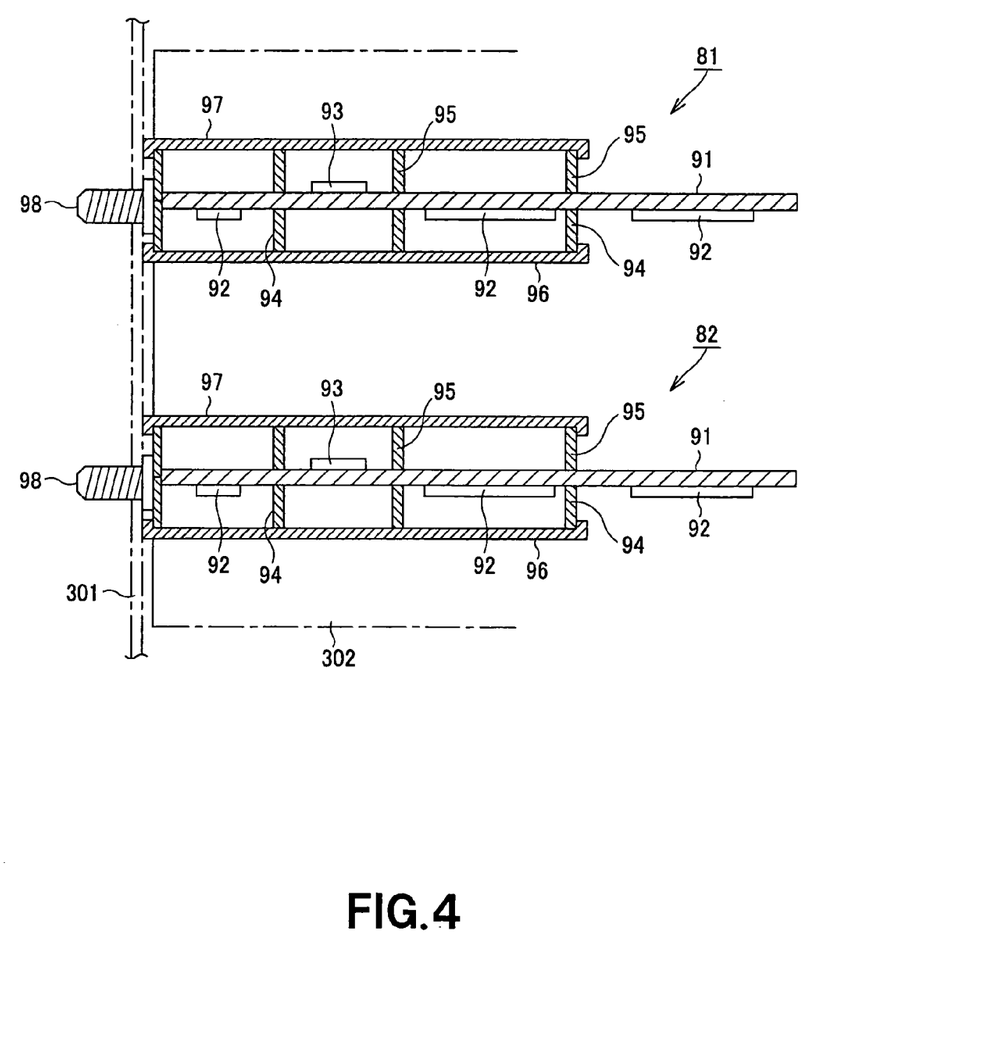
FIG. 4 is a side view showing first and second tuners arranged in a receiver.

Each of the first and second tuners 81 and 82 has the configuration as shown in, for example, FIGS. 3 and 4. That is, the first and second tuners 81 and 82 have the same configuration, in which components 92 and 93 including an IC and the like are mounted on both surfaces of a double-sided printed board 91 having a rectangular shape. Frame-like shield plates 94 and 95 are so disposed as to surround high frequency portion of the printed board 91, and are covered by plate-like shied covers 96 and 97. In FIG. 3, the shied cover 96 has been removed.

An antenna input connector 98 and a connector pin 99 are attached in parallel with the printed board 91 to one narrow side and one wide side of the printed board 91, respectively.

The above configured first and second tuners 81 and 82 are mounted, in parallel with each other, on a main printed board 302 such that the two connectors 98 and 98 project through a rear-end panel 301 of the receiver 80, as shown in FIG. 4. Attached to the printed board 302 are two connectors (not shown) into which the connector pins 99 and 99 of the first and second tuners 81 and 82 are inserted, thereby establishing physical connection between the first and second tuners 81 and 82, and printed board 302.

With this receiver 80 in which the video and audio signals of a TV program received by one of the first and second tuners 81 and 82 are output to the output terminals 88V and 88S, the user can enjoy TV broadcast. At the same time, it is possible for the user to record the TV program that he or she is watching onto the HDD 84, or to record the program on a different channel that has been received by the other one of the first and second tuners 81 and 82 onto the HDD 84. Further, the user can enjoy the programs that have been recorded onto the HDD 84.

Shielding of the tuner units using the shield case or the like as described above increases the number of components, which may lead to an increased product cost. Further, in order to provide the shield case, additional space becomes necessary between the base plates. This may prevent effective arrangement of the tuner units in the set-top box.

Further, when the tuner units are covered by the shield cases, electric field and magnetic field generated in the space within the shield case allow high frequency current to flow on the case surface. The high frequency current that has been propagated through the shield case may affect the other tuner circuit depending on the arrangement of the tuner units, which may cause mutual interference.

In the first and second tuners 81 and 82 configured as shown in FIGS. 3 and 4, when the first tuner 81 and the second tuner 82 are adjacently arranged, unnecessary radiation from the first tuner 81 goes into the second tuner 82, and conversely, unnecessary radiation from the second tuner 82 goes into the first tuner 81 to thereby generate mutual interference. As a result, the bit error rates or the like of the TSs output from both the tuners 81 and 82 are increased to deteriorate the performance.

Therefore, in each of the first and second tuners 81 and 82, the high frequency portion thereof is sealed by the shield plates 94 and 95, and the shield covers 96 and 97, thereby preventing mutual interference even when the first and second tuners 81 and 82 are adjacently arranged.

When the two sets of the shield plates 94, 95 and the shield covers 96, 97 are provided for the first and second tuners 81 and 82, respectively, the number of shield members is increased, with the result that the total number of the components is increased to lead to high product cost.

The mutual interference between the first and second tuners 81 and 82 can be reduced by arranging them on the main printed board 302 so as to be spaced sufficiently apart from each other. However, when the above arrangement is employed, the interval between the two connectors 98 and 98 is increased, not only to lower operating efficiency of the receiver 80, but to make the design of the appearance thereof impractical.

DISCLOSURE OF THE INVENTION

An object of the present invention is to provide a new signal receiving apparatus and signal receiving circuit capable of solving the above problems associated with the conventional receiver.

Another object of the present invention is to provide a signal receiving apparatus and a signal receiving circuit that reduce, with a simple structure, mutual interference generated when a plurality of tuners operate at a time.

Still another object of the present invention is to provide a signal receiving apparatus and a signal receiving circuit capable of reducing the performance degradation due to unnecessary radiation and realizing a reduction in product costs, in the receiver having a plurality of built-in tuners.

According to one aspect of the present invention proposed for accomplishing the above objects, there is provided a signal receiving apparatus including a plurality of signal receiving means having: an input means for inputting a broadcast wave in which a video signal and/or an audio signal are modulated in a predetermined format; a circuit board having a circuit for selecting, from the broadcast wave, a video signal and/or an audio signal included in a predetermined frequency band and demodulating the selected signals, and a mount layer on which the circuit is mounted, a first ground layer arranged, on the surface opposite to the surface on which the circuit of the mount layer is mounted, with a predetermined distance from the mount layer through a dielectric layer, and a second ground layer arranged with a predetermined distance from the first ground layer through a dielectric layer, the circuit having a microstripline structure. The signal receiving means are arranged such that the lowermost ground layer of one signal receiving means and the circuit mounting surface of another signal receiving means face each other. The signal receiving apparatus further includes: a decode means for decoding the video signal and/or audio signal that have been selected and demodulated; and an output means for outputting the demodulated video signal and/or audio signal to an external device.

In the signal receiving apparatus according to the present invention, disadvantages due to mutual interference caused by high frequency broadcast waves running between the signal receiving means can be reduced.

A plurality of signal receiving means may be provided for a broadcast wave. Alternatively, a plurality of signal receiving means may correspond to broadcast waves.

According to another aspect of the present invention, there is provided a signal receiving circuit comprising: an input means for inputting a broadcast wave in which a video signal and/or an audio signal are modulated in a predetermined format; a circuit for selecting, from the input broadcast wave, a video signal and/or an audio signal included in a predetermined frequency band and demodulating the selected signals, wherein a mount layer on which the circuit is mounted, a first ground layer arranged on the opposite surface of the surface on which the circuit is mounted with a predetermined distance from the mount layer through a dielectric layer, and a second ground layer arranged with a predetermined distance from the first ground layer through a dielectric layer are sequentially stacked, the circuit has a microstripline structure. In the signal receiving circuit according to the present invention, disadvantages due to mutual interference caused by high frequency broadcast waves when the signal receiving means adjacently arranged.

In particular, it is preferable that a dielectric layer be provided between the mount layer and the uppermost ground layer, and between the respective ground layers.

A receiver according to the present invention includes at least first and second tuners. Each of the first and second tuners has a double-sided printed board and predetermined components. The double-sided printed board has one surface serving as components mounting surface and other surface the whole area of which serves as a ground surface. Wiring patterns of the mounting surfaces of the first and second tuners are configured to be substantially in plane-symmetry with the components mounted on the respective mounting surfaces also arranged in substantially in plane-symmetry, and the first and second tuners are arranged in the apparatus such that the ground surfaces of the respective double-sided printed boards face each other.

The double-sided printed boards of the first and second tuners are shielded from each other by respective ground surfaces thereof, thereby suppressing unnecessary radiation.

The above and other objects, advantages and features of the present invention will be more apparent from the following description taken in conjunction with the accompanying drawings.

BEST MODE FOR CARRYING OUT THE INVENTION

A tuner circuit and a signal receiving apparatus including the tuner circuit to which the present invention is applied will be described in detail with reference to the accompanying drawings.

Figure 5:
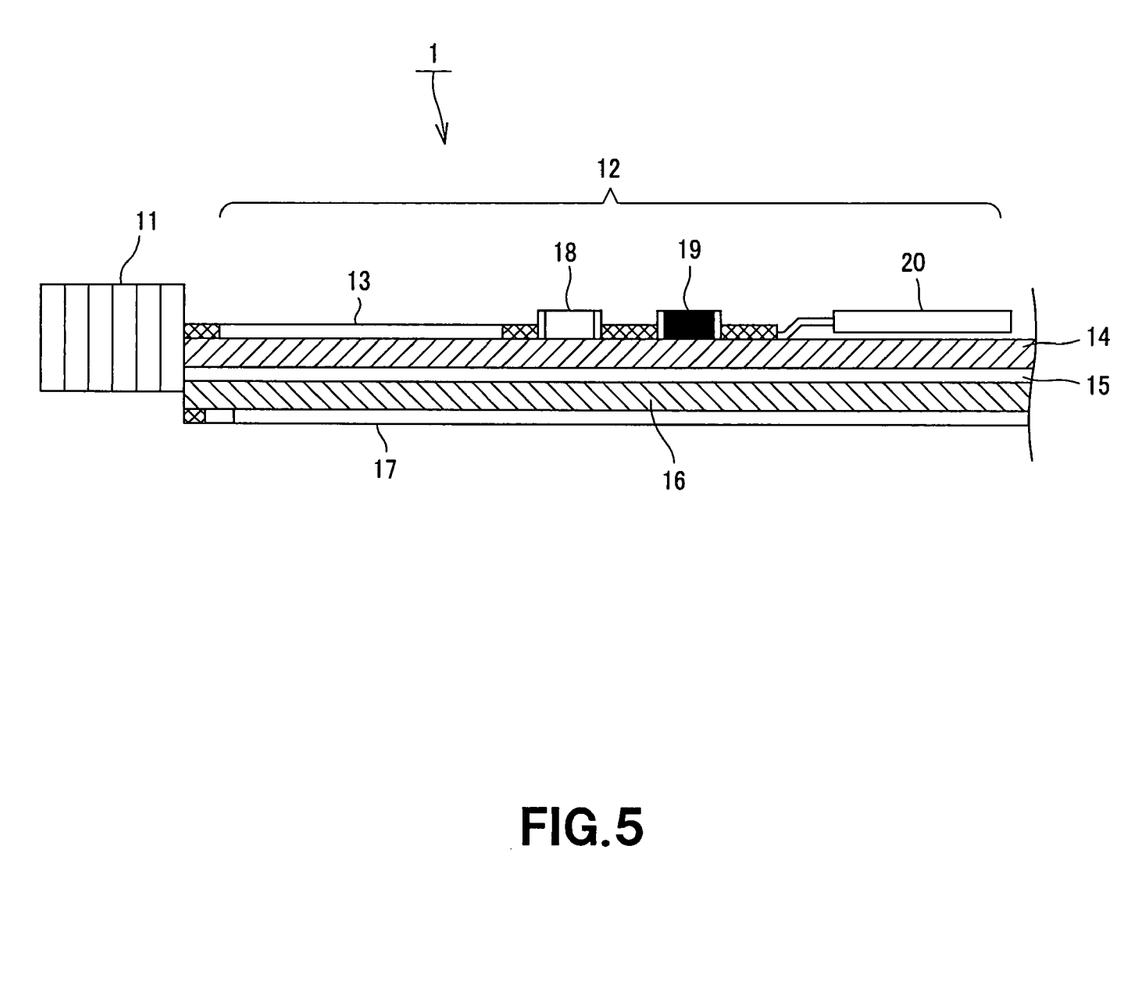
FIG. 5 is a side view of a tuner circuit board to which the present invention is applied.

FIG. 5 is a side view showing a base plate of a tuner circuit 1 to which the present invention is applied. The tuner circuit 1 is a circuit board in which circuits for receiving signals are designed, according to a microstripline structure, on a multi-layer board. The tuner circuit 1 receives broadcast waves that have been modulated in a predetermined format, and demodulates the received waves. The tuner circuit 1 shown here includes a circuit configuration for receiving, for example, DVB-S (Digital VideoBroadcast-Satellite).

The tuner circuit 1 includes an input terminal 11 to which a broadcast wave in which a video signal and/or an audio signal are modulated in a predetermined format is input, and a mount layer 13 on which a main circuit 12 for selecting, from the broadcast wave, a video signal and/or an audio signal included in a predetermined frequency band is arranged. In the tuner circuit 1, a first ground layer 15 is disposed, through a first dielectric layer 14, on the surface opposite to that on which the main circuit 12 of the mount layer 13 is arranged, and a second ground layer 17 is disposed through a second dielectric layer 16.

The main circuit 12 includes a condenser 18 for cutting a direct current component, and a resistor 19 for generating a bias voltage. The broadcast wave that has been input is transferred to an IC 20 via the condenser 18 and the resistor 19.

Figure 6:
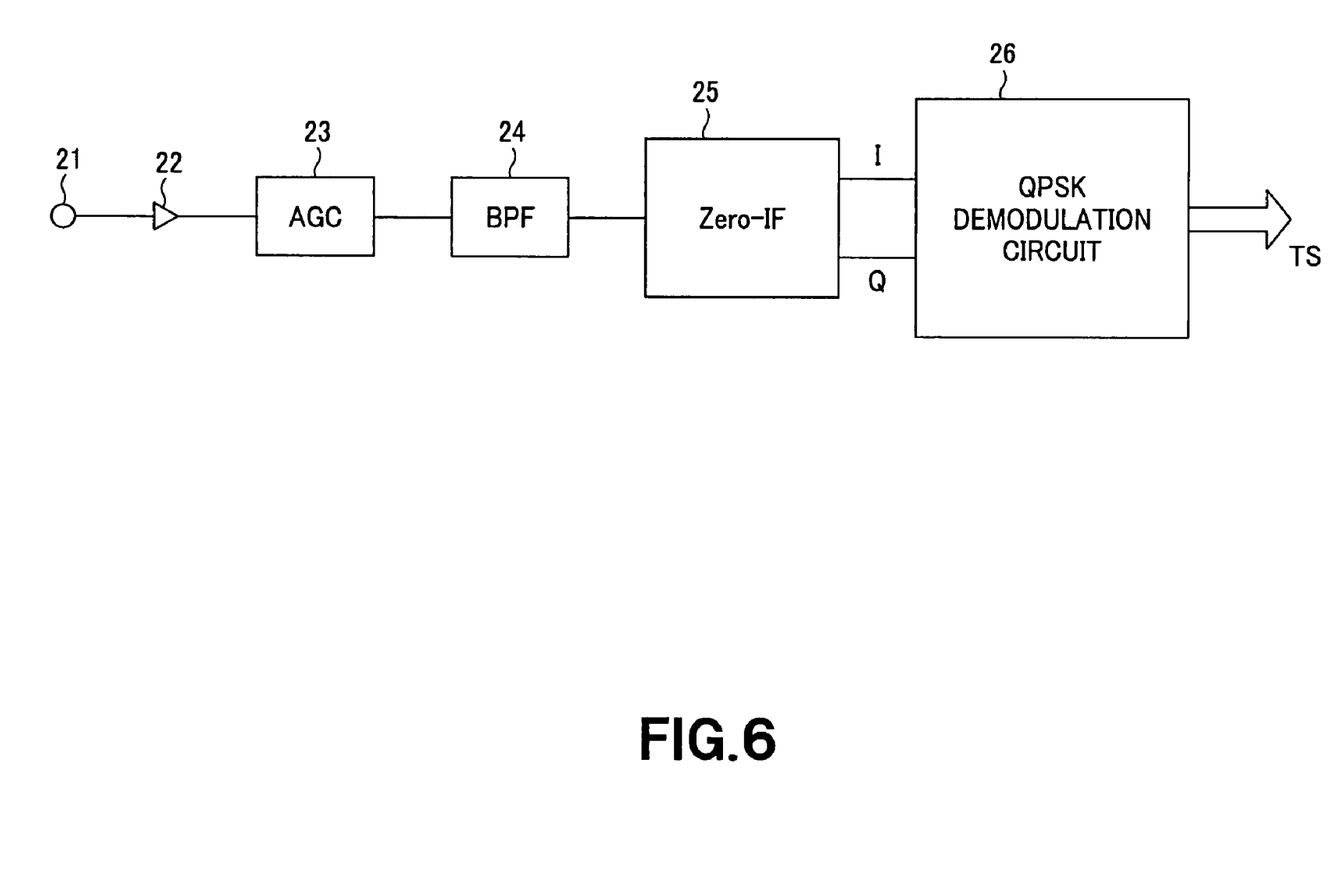
FIG. 6 is a block diagram showing an IC unit of the tuner circuit.

More specifically, the IC 20 includes, as shown in FIG. 6, an input terminal 21, an amplifier 22 for amplifying the input broadcast wave, an AGC (Auto Gain Controller) 23 for adjusting a gain, a BPF (Band-pass Filter) 24 for extracting an intermediate frequency, a Zero-IF25 for extracting an I-component and a Q-component from the intermediate frequency, and a QPSK demodulation circuit 26 for demodulating the broadcast wave input from the I-component and Q-component. With the above configuration, the modulated broadcast wave that has been input through the input terminal 11 are demodulated into a TS (Transport Stream).

Figure 7:
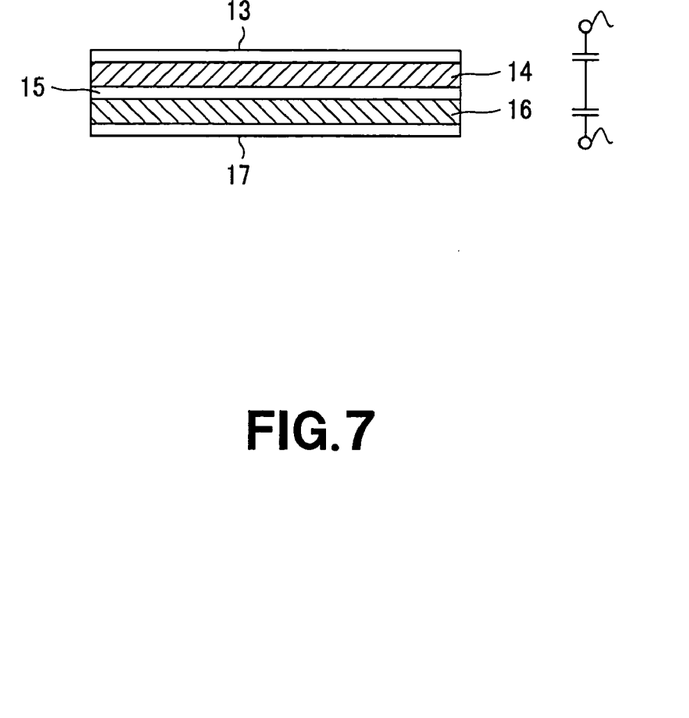
FIG. 7 is a view showing the tuner circuit of FIG. 6 as an equivalent circuit.

FIG. 7 shows a capacity coupling between the mount layer 13, dielectric layers 14 and 16, and ground layers 15 and 17, as an equivalent circuit. Since the first ground layer 15 is interposed between the mount layer 13 serving as a radiation source of electromagnetic field and the second ground layer 17, the mount layer 13 is coupled to the ground layer 17, which can be a radiation source, through two capacitances.

Figure 8:
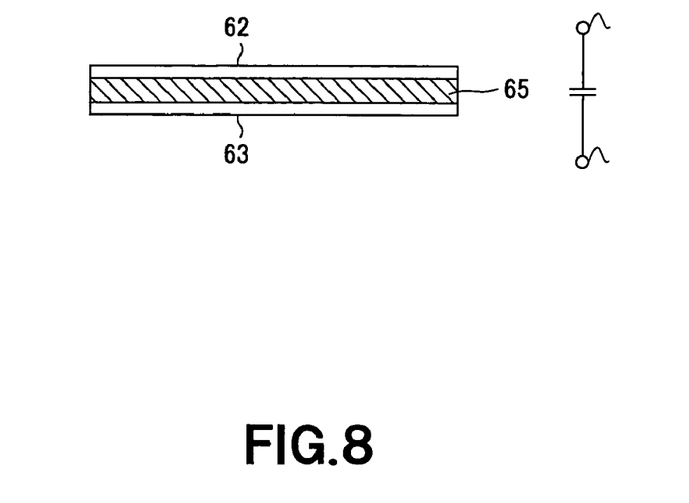
FIG. 8 is a view showing the conventional tuner circuit as an equivalent circuit.

As shown in FIG. 7, by disposing the two ground layers and dielectric layer interposed between the two ground layers, the capacitance value between base plates corresponds to the series capacitance of two condensers. Thus, assuming that the coupling degree between the layers is the same, by employing the multilayer board structure, actual capacitance can be reduced to ½ of the capacitance in the case of the equivalent circuit shown in FIG. 8.

The tuner circuit 1 having the aforementioned configuration includes the mount layer 13, the first ground layer 15, and the second ground layer 17, and further includes the first dielectric layer 14 between the mount layer 13 and the first ground layer 15, and the second dielectric layer 16 between the first ground layer 15 and the second ground layer 17. Therefore, high frequency current that flows from the condenser 18, the resistor 19, and the IC 20 to the first ground layer 15 can be shielded by the second dielectric layer 16 and the second ground layer 17, thereby effectively reducing the level of the high frequency signals radiated from the second ground layer 17.

Figure 9:
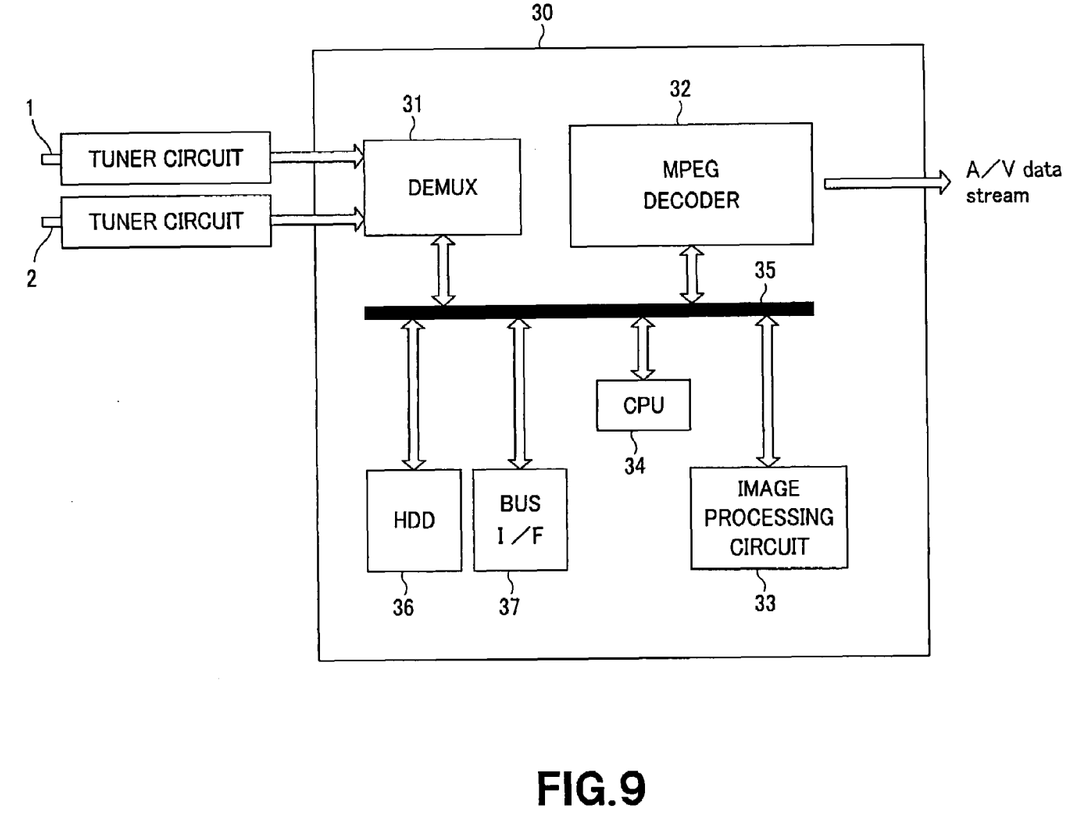
FIG. 9 is a block diagram explaining an example of a set-top box provided with the tuner circuit.

A description will next be given of a set-top box 30 provided with the aforementioned tuner circuit 1 with reference to FIG. 9. The set-top box 30 shown in FIG. 9 includes first and second tuner circuits 1 and 2 arranged in parallel with each other, and can receive signals having the same frequency yet differing in level. The first and second tuner circuits 1 and 2 have substantially the same configuration, and can be used equally. To distinguish the components of the second tuner circuit 2 from those of the first tuner circuit 1, character "a" is added to respective reference numerals denoting the components of the second tuner circuit 2.

The set-top box 30 includes a DEMUX (Demultiplexer) 31 that receives inputs of transport streams from the first and second tuner circuits 1 and 2, and demultiplexes them to separately derive the video data, audio data, and the like, an MPEG decoder 32 that decodes the video data and audio data conforming to MPEG (Moving Picture Experts Group) format that have been derived by the DEMUX 31, an image processing circuit 33, and a CPU 34 that controls the above components. These components are connected to each other via a bus line 35. The set-top box 30 further includes an HDD 36 that records video data, audio data, and the like, and a bus interface 37.

Figure 10:
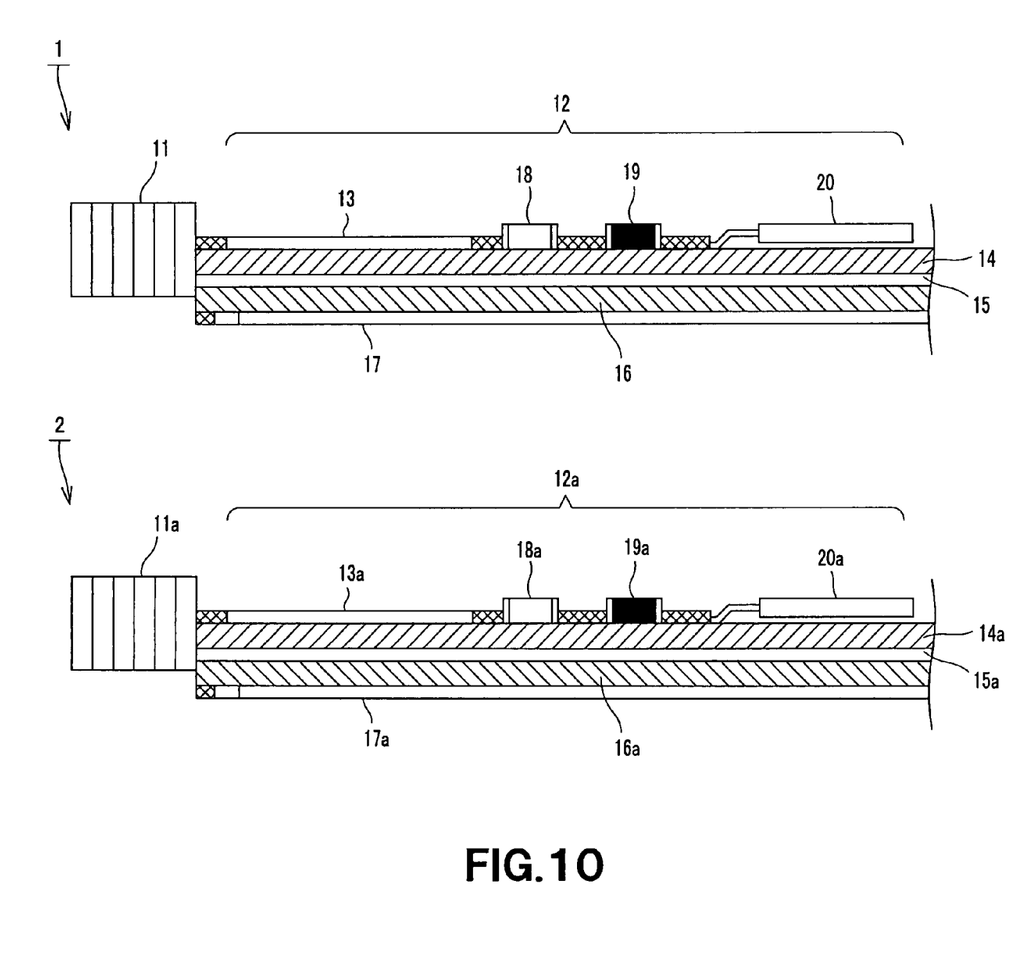
FIG. 10 is a view for explaining an arrangement of the tuner circuit board in a set-top box.

In the set-top box 30, the first and second tuner circuits 1 and 2 are provided at the front stage of the DEMUX 31. More specifically, as shown in FIG. 10, the first and second tuner circuits 1 and 2 are arranged in parallel with each other such that the second ground layer 17 of the first tuner circuit 1 and the main circuit 12a of the second tuner circuit 2 face each other.

The radiation is generated in the ground layer 17 that faces the mount layer 13a of the second tuner circuit 2 from the main circuit 12a. However, it is possible to prevent the radiation from easily reaching the main circuit 12 of the tuner circuit 1, so that the interference hardly occurs.

Figure 11:
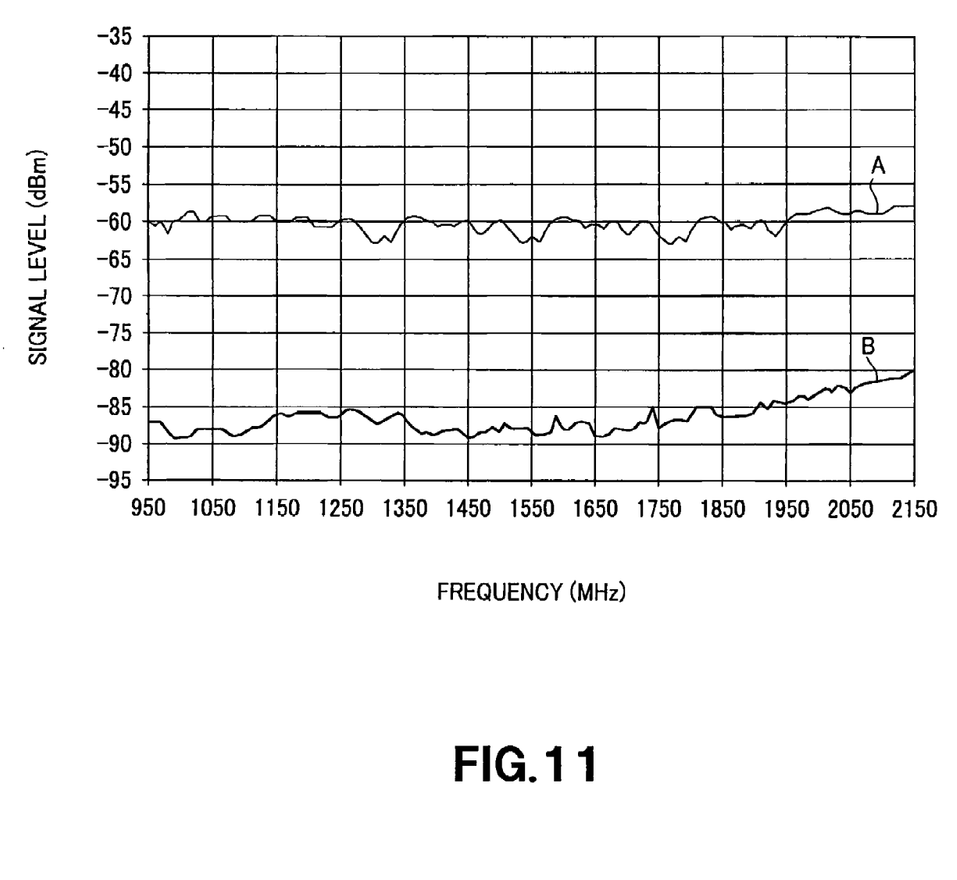
FIG. 11 is a graph explaining a relationship between the signal level of the interference wave detected in the adjacently arranged tuner circuits receiving DVB-S and the signal level of DVB-S.

Here, in a state where one tuner circuit actually receives DVB-S (Digital VideoBroadcast-Satellite), the signal level received by the other tuner circuit is measured. FIG. 11 shows the result.

In the graph shown in FIG. 11, signal behavior indicated by A shows the result obtained by the same measurement for the conventional tuner circuit shown in FIG. 1. Signal behavior indicated by B shows the result in the case of the set-top box 30 in which the first and second tuner circuits 1 and 2 are arranged in parallel with each other.

As can be seen from FIG. 11, in the tuner circuit 1 to which the present invention is applied, since a plurality of ground layers are provided, the radiation between adjacent tuner circuits can be suppressed. Accordingly, mutual interference caused by high frequency current component is reduced, so that satisfactory signal reception characteristics can be obtained.

The present invention is not limited to the above-described embodiment, and can be variously modified without departing from the spirit and scope of the invention. For example, tuner circuits are not limited to those corresponding to the same frequency. It is possible to use tuner circuits each of which corresponds to broadcast waves.

Another embodiment of the present invention will be described with reference to FIGS. 12A and 12B, and FIG. 13.

Figure 12A:
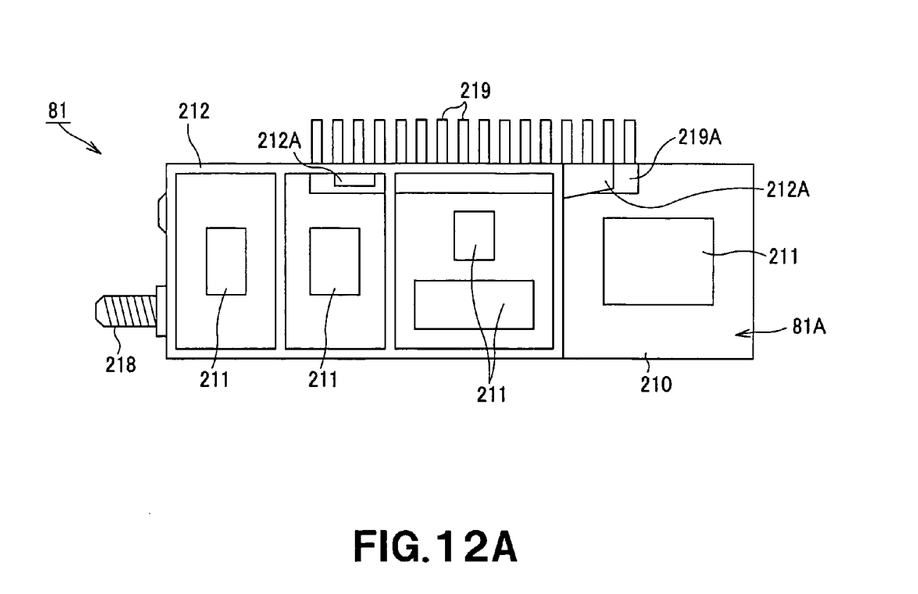
FIGS. 12A and 12B are plan views showing first and second tuner, respectively.
Figure 12B:
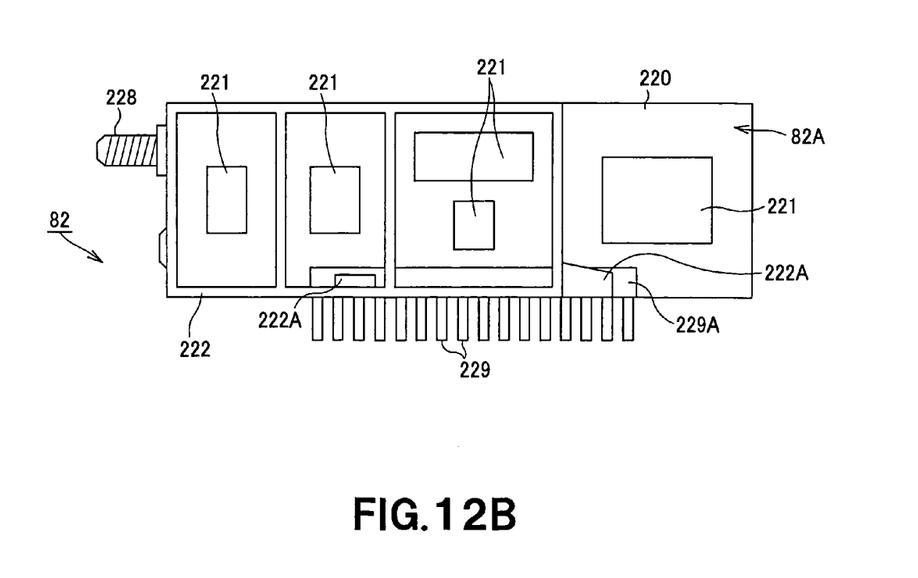

FIG. 12A shows a first tuner 81; FIG. 12B shows a second tuner 82; and FIG. 13 is a side view of the first and second tuners 81 and 82 mounted in a receiver.

In the first tuner 81, a printed board 210 serves as a rectangular double-sided board, and one side surface 81A of which a wiring pattern is formed. Various components 211 such as an IC are mounted on the wiring pattern. On the other surface 81B of the printed board 210, a conductive pattern is formed overall. The conductive pattern is connected to a ground pattern of the component side surface 81A to allow the surface 81B to have a ground potential across the entire surface. Therefore, the surface 81B of the printed board 210 serves as a ground surface. A frame-like shield plate 212 is provided on the component side surface 81A of the circuit board 210 so as to surround high frequency portion of the surface 81A.

An antenna input connector 218 and connector pin 219 are mounted in parallel with the printed board 210 to one narrow side and one wide side of the component side surface 81A of the printed board 210, respectively. The connector pin 219 is implanted into an insulating portion 219A. In this state, a part of the shield plate 212 is bent to allow the bent portion 212A to bear down the insulating portion 219A of the connector pin 219 on the component side surface 81A.

The second tuner 82 has the same configuration as that of the first tuner 81. Here, reference numerals 220 to 229A are given to the components corresponding to the components 210 to 219A of the first tuner 81, and descriptions thereof are omitted. As can be seen from the comparison between the printed board 210 of the first tuner 81 and the printed board 220 of the second tuner 82 shown in FIG. 12A and FIG. 12B, respectively, wiring patterns of the component side surfaces 81A and 82A are configured to be in plane-symmetry. Thus, main components of the components 211 and 221 to be mounted on the component side surfaces 81A and 82A are arranged in substantially plane-symmetry.

The first and second tuners 81 and 82 configured as described above are, as shown in FIG. 13, mounted to the main printed board 302 such that the printed boards 210 and 220 are in parallel with each other, the ground surface 81B of the printed board 210 and the ground surface 82B of the printed board 220 face each other, and the connectors 218 and 228 project through a rear-end panel 301 of the receiver 80.

Provided for the printed board 302, are two connectors (not shown) into which the connector pins 219 and 229 of the first and second tuners 81 and 82 are inserted, thereby establishing connection between the first and second tuners 81 and 82, and printed board 302.

With the above configuration, the ground surfaces 81B and 82B of the printed boards 210 and 220 act as shields. Therefore, even if unnecessary radiation is given from one of the first and second tuners 81 and 82 to the other one of them, the radiation is attenuated due to the presence of the ground surface 81B or 82B, thereby reducing the mutual interference caused by the unnecessary radiation between the first and second tuners 81 and 82. Therefore, it is possible to adjacently arrange the first and second tuners 81 and 82. Further, it is possible to prevent an increase in bit error rate of the TS output from the tuners 81 and 82 to thereby keep performance from being degraded.

Figure 13:
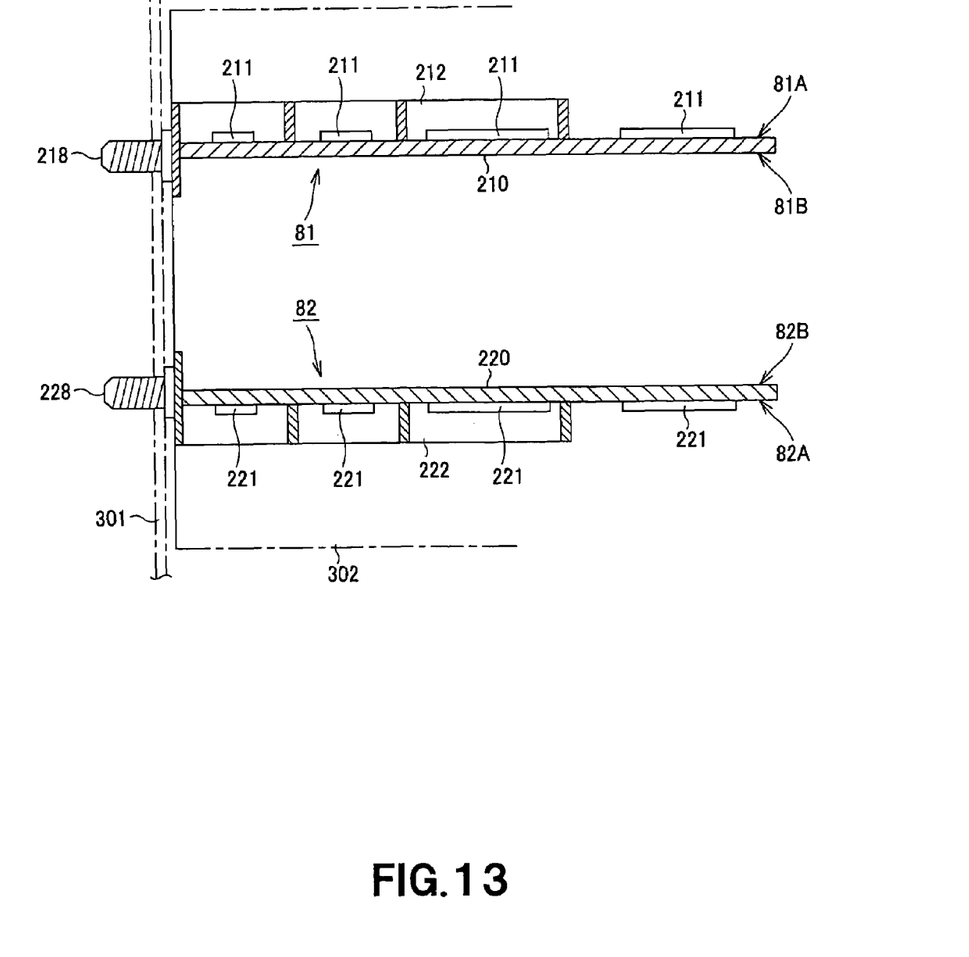
FIG. 13 is a side view showing first and second tuners arranged in a receiver.

As shown in FIG. 13, it is only necessary that shield plates 212 and 222 be provided for the first and second tuners 81 and 82, respectively. Thus, the number of shield members can be reduced as compared to the case of the tuners shown in FIG. 4. Further, it is not necessary to leave plenty of space between the first and second tuners 81 and 82 in arranging them on the main board 302, preventing the interval between the two connectors 218 and 219 from being widened needlessly. Further, operating efficiency of the receiver 80 and design of the appearance of the receiver are not impaired.

Further, outer shapes of the printed boards 210 and 220 of the first and second tuners 81 and 82 can be made the same, and the printed boards 210 and 220 can be configured to be in plane-symmetry, thereby eliminating additional cost related to a board die and additional man-hour related to designing. Therefore, it is possible not only to easily assure an isolation between the first and second tuners 81 and 82, but also to obtain 2-channel TS outputs having uniform characteristics.

The aforementioned first and second tuners 81 and 82 may be configured to receive the digital satellite broadcasts different from each other. The TS output from the tuners 81 and 82 can be used for any purpose including not only for recording a program while watching other program, but also for picture in picture function.

The present invention is not limited to the embodiments described above with reference to the drawings but it would be obvious to those skilled in the art that various modifications, substitutions, and equivalents of the present invention can be achieved without deviating from the scope and the subject matter of the appended claims.

INDUSTRIAL APPLICABILITY

As has been described above, according to the signal receiving apparatus of the present invention, it is possible to reduce electromagnetic interference such as cross talk due to mutual interference caused when adjacently arranged tuners operate in a time. Further, it is possible to achieve, with a simpler configuration, advantages comparable or superior to the conventional method in which the metal shield case is used to shield electromagnetic wave, thereby improving space efficiency and product cost, and realizing size reduction of the apparatus itself.

Further, according to the signal receiving circuit of the present invention, it is possible to reduce electromagnetic interference such as cross talk due to mutual interference even when the signal receiving circuits are adjacently arranged. Further, it is possible to achieve, with a simpler configuration, advantages comparable or superior to the conventional method in which the metal shield case is used to shield electromagnetic wave, thereby improving space efficiency, and realizing size reduction of the receiver constituted by using the signal receiving circuit.

Further, the configuration of the present invention can reduce the number of expensive shield members, leading to cost reduction of the receiver. In addition, since the mutual interference between the tuners can be reduced, performance degradation hardly occurs. Since it is not necessary to leave plenty of space between two tuners, operating efficiency of the receiver and design of the appearance of the receiver are not impaired. Further, additional cost related to the die for manufacturing a printed board that constitutes the tuner and additional man-hour related to designing will not arise. Further, 2-channel TS outputs having uniform characteristics can be obtained.

The invention claimed is:

1. A signal receiving apparatus comprising
a plurality of signal receiving means including:
input means for inputting a broadcast wave in which a video signal and/or an audio signal are modulated in a predetermined format;
a circuit board having a circuit for selecting, from the broadcast wave, a video signal and/or an audio signal included in a predetermined frequency band and demodulating the selected signals, and a mount layer on which the circuit is mounted, a first ground layer arranged, on the surface opposite to the surface on which the circuit of the mount layer is mounted, with a predetermined distance from the mount layer through a dielectric layer, and a second ground layer arranged with a predetermined distance from the first ground layer through a dielectric layer, the circuit having a microstripline structure, wherein
the signal receiving means are arranged such that the lowermost ground layer of one signal receiving means and the circuit mounting surface of another signal receiving means face each other, and
the signal receiving apparatus further comprising:
decode means for decoding the video signal and/or audio signal that have been selected and demodulated, and
output means for outputting the demodulated video signal and/or audio signal to an external device.

2. The signal receiving apparatus according to claim 1, wherein the plurality of signal receiving means are provided for a broadcast wave.

3. The signal receiving apparatus according to claim 1, wherein the plurality of signal receiving means correspond to broadcast waves.

4. The signal receiving apparatus according to claim 1, comprising recording means for storing the video signal and/or audio signal.

5. A signal receiving circuit comprising:
input means for inputting a broadcast wave in which a video signal and/or an audio signal are modulated in a predetermined format;
a circuit for selecting, from the input broadcast wave, a video signal and/or an audio signal included in a predetermined frequency band and demodulating the selected signals,
wherein a mount layer on which the circuit is mounted, a first ground layer arranged on the opposite surface of the surface on which the circuit is mounted with a predetermined distance from the mount layer through a dielectric layer, and a second ground layer arranged with a predetermined distance from the first ground layer through a dielectric layer are sequentially stacked, and
the circuit has a microstripline structure.

6. A receiver comprising; at least first and second tuners, wherein
each of the first and second tuners has a double-sided printed board and predetermined components, the double-sided printed board having one surface serving as components mounting surface and other surface the whole area of which serves as a ground surface,
wiring patterns of the mounting surfaces of the first and second tuners are configured to be substantially in plane-symmetry with the components mounted on the respective mounting surfaces also arranged in substantially in plane-symmetry, and
the first and second tuners are arranged in the apparatus such that the ground surfaces of the respective double-sided printed boards face each other.

7. The receiver according to claim 6, wherein the each of the double-sided printed boards of the first and second tuners includes an antenna input connector, and the double-sided printed board of the first and second tuners are arranged such that the antenna input connectors project through a rear-end panel of the receiver.

8. The receiver according to claim 7, wherein the first and second tuners are configured to receive digital satellite broadcasts.

9. The receiver according to claim 7, comprising a device that stores and reproduces programs of the digital satellite broadcasts.

* * * * *

UNITED STATES PATENT AND TRADEMARK OFFICE
CERTIFICATE OF CORRECTION

PATENT NO. : 7,634,225 B2 Page 1 of 1
APPLICATION NO. : 10/510289
DATED : December 15, 2009
INVENTOR(S) : Kawakami et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1470 days.

Signed and Sealed this

Ninth Day of November, 2010

David J. Kappos
*Director of the United States Patent and Trademark Office*